(12) United States Patent
Ren et al.

(10) Patent No.: US 10,685,989 B2
(45) Date of Patent: Jun. 16, 2020

(54) METHOD FOR MANUFACTURING DISPLAY PANEL, DISPLAY PANEL, AND DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Xingfeng Ren, Beijing (CN); Guoquan Liu, Beijing (CN); Zhengwei Chen, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 179 days.

(21) Appl. No.: 16/023,720

(22) Filed: Jun. 29, 2018

(65) Prior Publication Data
US 2019/0096924 A1 Mar. 28, 2019

(30) Foreign Application Priority Data
Sep. 25, 2017 (CN) .......................... 2017 1 0876367

(51) Int. Cl.
*H01L 23/12* (2006.01)
*H01L 23/52* (2006.01)
(Continued)

(52) U.S. Cl.
CPC ........ *H01L 27/1244* (2013.01); *G02F 1/1368* (2013.01); *G02F 1/133345* (2013.01);
(Continued)

(58) Field of Classification Search
CPC ............. H01L 27/1259; H01L 27/1296; H01L 27/3279; H01L 27/3276; G02F 1/136286; G02F 1/133345; G02F 1/368
See application file for complete search history.

(56) References Cited

U.S. PATENT DOCUMENTS 9,958,747 B2 * 5/2018 Bai ..................... G02F 1/13439
2014/0167079 A1 6/2014 Chen et al.
(Continued)

FOREIGN PATENT DOCUMENTS

| CN | 101373299 A | 2/2009 |
|---|---|---|
| CN | 103022052 A | 4/2013 |
| CN | 104678664 A | 6/2015 |

OTHER PUBLICATIONS

First office action of Chinese application No. 201710876376.3 dated Jul. 26, 2019.

*Primary Examiner* — Alonzo Chambliss
(74) *Attorney, Agent, or Firm* — Fay Sharpe LLP

(57) ABSTRACT

A method for manufacturing a display panel, a display panel, and a display device are provided. The method includes: forming a plurality of gate lines and a common electrode line pattern on a base substrate; forming an insulating layer on the base substrate on which the plurality of gate lines and the common electrode line pattern are formed; forming a via hole on the insulating layer; and forming a metal conductive pattern on the base substrate on which the insulating layer is formed. The common electrode line and the common electrode connection block located on two sides of a gate line are electrically connected through a bridging structure in a conductive layer made of metal, which reduces the resistance of the bridging structure, so that the voltage uniformity throughout the common electrode line pattern which is bridged through the bridging pattern is high.

20 Claims, 6 Drawing Sheets

(51) Int. Cl.

| | |
|---|---|
| *H01L 21/4763* | (2006.01) |
| *H01L 27/12* | (2006.01) |
| *H01L 29/24* | (2006.01) |
| *H01L 29/786* | (2006.01) |
| *G02F 1/1362* | (2006.01) |
| *G02F 1/1368* | (2006.01) |
| *H01L 27/32* | (2006.01) |
| *G02F 1/1333* | (2006.01) |

(52) U.S. Cl.
CPC .... *G02F 1/136286* (2013.01); *H01L 27/1225* (2013.01); *H01L 27/1259* (2013.01); *H01L 27/1296* (2013.01); *H01L 27/3279* (2013.01); *H01L 29/24* (2013.01); *H01L 29/7869* (2013.01); *G02F 2201/121* (2013.01); *G02F 2201/123* (2013.01); *H01L 27/3262* (2013.01); *H01L 2251/5392* (2013.01); *H01L 2251/568* (2013.01)

(56) References Cited

U.S. PATENT DOCUMENTS

| | | | |
|---|---|---|---|
| 2015/0153600 A1 | 6/2015 | Won et al. | |
| 2016/0035760 A1* | 2/2016 | Ning | H01L 27/1248 |
| | | | 257/43 |
| 2017/0162609 A1 | 6/2017 | Kao et al. | |

* cited by examiner

METHOD FOR MANUFACTURING DISPLAY PANEL, DISPLAY PANEL, AND DISPLAY DEVICE

This application claims priority to Chinese Patent Application No. 201710876367.3, filed with the State Intellectual Property Office on Sep. 25, 2017 and titled "Method for Manufacturing Display Panel, Display Panel, and Display Device", the entire contents of which are incorporated herein by reference.

TECHNICAL FIELD

The present disclosure relates to a method for manufacturing a display panel, a display panel, and a display device.

BACKGROUND

A base substrate in a display panel is usually provided with a plurality of gate lines and a common electrode line pattern for providing a stable and uniform voltage which is provided in the same layer as the plurality of gate lines. The common electrode line pattern is located in a plurality of regions divided by the plurality of gate lines.

SUMMARY

The present disclosure provides a method for manufacturing a display panel, a display panel, and a display device.

In a first aspect, there is provided a method for manufacturing a display panel, comprising steps of: forming a plurality of gate lines and a common electrode line pattern on a base substrate, the common electrode line pattern comprising a plurality of common electrode lines and a plurality of common electrode connection blocks, and one common electrode line and one common electrode connection block being respectively formed on two sides of any one of the gate lines; forming an insulating layer on the base substrate on which the plurality of gate lines and the common electrode line pattern are formed; forming a via hole on the insulating layer; and forming a metal conductive pattern on the base substrate on which the insulating layer is formed, wherein the metal conductive pattern comprises a source/drain pattern and a bridging pattern, the bridging pattern comprising a plurality of bridging structures, and any of the bridging structures being electrically connected with a common electrode line and a common electrode connection block which are adjacent on two sides of one of the plurality of gate lines through the via hole.

Optionally, the insulating layer comprises a gate insulating layer and an etch stop layer, said step of forming an insulating layer on the base substrate on which the plurality of gate lines and the common electrode line pattern are formed comprises: forming the gate insulating layer on the base substrate on which the plurality of gate lines and the common electrode line pattern are formed; and forming the etch stop layer on the base substrate on which the gate insulating layer is formed.

Optionally, said step of forming a via hole on the insulating layer comprises: forming the via hole on the etch stop layer and the gate insulating layer.

Optionally, before said step of forming the etch stop layer on the base substrate on which the gate insulating layer is formed, the method further comprising: forming an active layer on the base substrate on which the gate insulating layer is formed; and said step of forming the etch stop layer on the base substrate on which the gate insulating layer is formed comprises: forming the etch stop layer on the base substrate on which the active layer is formed.

Optionally, before said step of forming a plurality of gate lines and a common electrode line pattern on a base substrate, the method further comprises: forming a transparent conductive pattern on the base substrate; and said step of forming a plurality of gate lines and a common electrode line patters on a base substrate comprises: forming the plurality of gate lines and the common electrode line pattern on the base substrate on which the transparent conductive pattern is formed, the common electrode line pattern being electrically connected with the transparent conductive pattern.

Optionally, said step of forming the plurality of gate lines and the common electrode line pattern on the base substrate on which the transparent conductive pattern is formed comprises: forming the plurality of gate lines and the common electrode line pattern on the base substrate on which the transparent conductive pattern is formed by one patterning process.

Optionally, after said step of forming a metal conductive pattern on the base substrate on which the insulating layer is formed, the method further comprises: forming a passivation layer on the base substrate on which the metal conductive pattern is formed; and forming a pixel electrode pattern on the base substrate on which the passivation layer is formed.

Optionally, in the base substrate, the plurality of common electrode connection blocks are electrically connected with the bridging structures in the bridging pattern in one-to-one correspondence.

Optionally, in the base substrate, each of the plurality of common electrode lines is electrically connected with one of the bridging structures.

In a second aspect, there is provided display panel, comprising a base substrate;

wherein a plurality of gate lines and a common electrode line pattern are disposed on the base substrate, the common electrode line pattern comprising a plurality of common electrode lines and a plurality of common electrode connection blocks, one common electrode line and one common electrode connection block being respectively formed on two sides of any one of the gate lines; an insulating layer is disposed on the base substrate on which the plurality of gate lines and the common electrode line pattern are disposed; a via hole is disposed on the insulating layer; and a metal conductive pattern is disposed on the base substrate on which the insulating layer is disposed, the metal conductive pattern comprising a source/drain pattern and a bridging pattern comprising a plurality of bridging structures, and any of the bridging structures being electrically connected with a common electrode line and a common electrode connection block which are adjacent on two sides of one of the plurality of gate lines through the via hole.

Optionally, the insulating layer comprises a gate insulating layer and an etch stop layer, the gate insulating layer is disposed on the base substrate on which the plurality of gate lines and the common electrode line pattern are disposed; and the etch stop layer is disposed on the base substrate on which the gate insulating layer is disposed.

Optionally, an orthogonal projection of the via hole on the base substrate and an orthographic projection of a region where a thin film transistor is located on the base substrate do not overlap.

Optionally, an active layer is disposed on the base substrate on which the gate insulating layer is disposed; and the etch stop layer is disposed on the base substrate on which the active layer is disposed.

Optionally, a transparent conductive pattern is further disposed on the base substrate, and the plurality of gate lines and the common electrode line pattern are disposed on the base substrate on which the transparent conductive pattern is disposed, and the common electrode line pattern is electrically connected with the transparent conductive pattern.

Optionally, the plurality of gate lines and the common electrode line pattern are disposed in the same layer.

Optionally, a passivation layer is disposed on the base substrate on which the metal conductive pattern is disposed, and a pixel electrode pattern is disposed on the base substrate on which the passivation layer is disposed.

Optionally, the material of the active layer comprises indium gallium zinc oxide.

Optionally, the material of the gate insulating layer comprises silicon nitride.

Optionally, the material of the etch stop layer comprises silicon nitride.

In a third aspect, there is provided a display device, comprising a display panel, the display panel comprising a base substrate, wherein a plurality of gate lines and a common electrode line pattern are disposed on the base substrate, the common electrode line pattern comprising a plurality of common electrode lines and a plurality of common electrode connection blocks, and one common electrode line and one common electrode connection block being respectively formed on two sides of any one of the gate lines; an insulating layer is disposed on the base substrate on which the plurality of gate lines and the common electrode line pattern are disposed; a via hole is disposed on the insulating layer; a metal conductive pattern is disposed on the base substrate on which the insulating layer is disposed, the metal conductive pattern comprising a source/drain pattern and a bridging pattern comprising a plurality of bridging structures, and any of the bridging structures being electrically connected with a common electrode line and a common electrode connection block which are adjacent on two sides of one of the plurality of gate lines through the via hole.

DETAILED DESCRIPTION

To make the principles and advantages of the present disclosure more clear, the embodiments of the present disclosure will be further described in detail below in conjunction with the accompanying drawings.

In the process of implementing the present disclosure, the inventors found that the related art has at least the following problems: since the resistance of a transparent conductive material constituting a transparent conductive pattern is generally large, the voltage uniformity is low throughout a common electrode line pattern bridging through the transparent conductive pattern. A method for manufacturing a display panel, a display panel, and a display device are provided according to the embodiments of the present disclosure, which can solve the problem in the related art that the resistance of a transparent conductive material constituting a transparent conductive pattern is generally large and thus the voltage uniformity is low throughout a common electrode line pattern bridging through the transparent conductive pattern.

Figure 1:
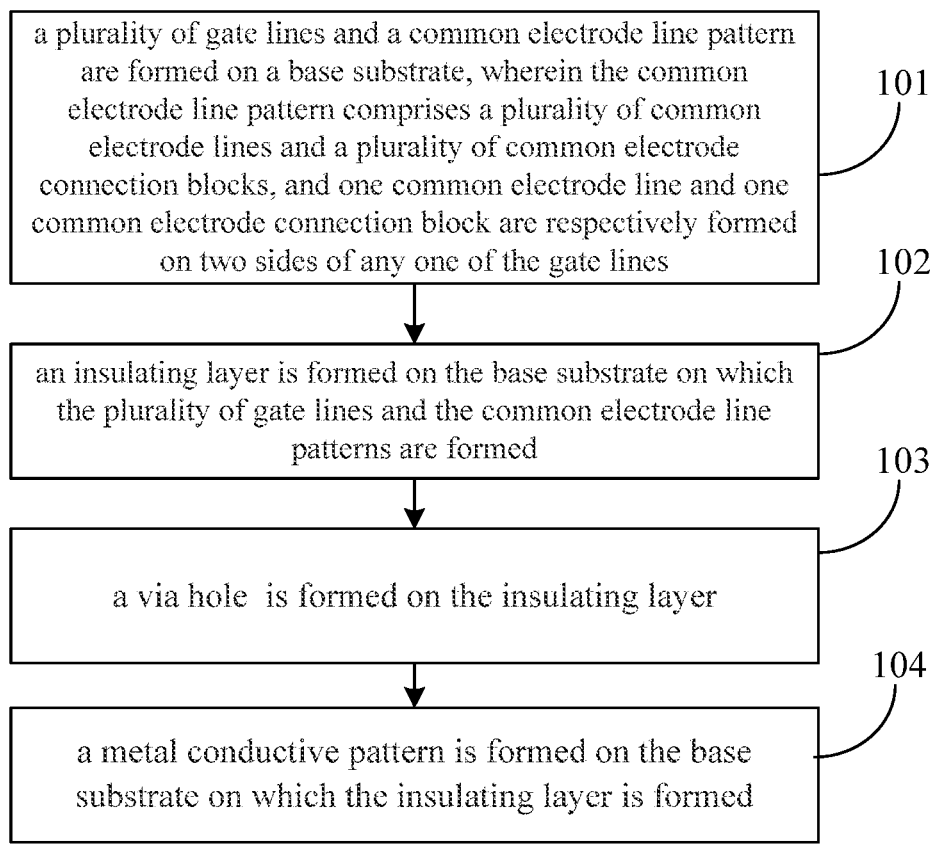
FIG. 1 is a flowchart of a method for manufacturing a display panel in accordance with an embodiment of the present disclosure.

FIG. 1 is a flowchart of a method for manufacturing a display panel in accordance with an embodiment of the present disclosure. The method may include the following steps:

In step 101, a plurality of gate lines and a common electrode line pattern are formed on a base substrate, wherein the common electrode line pattern comprises a plurality of common electrode lines and a plurality of common electrode connection blocks, and one common electrode line and one common electrode connection block are respectively formed on two sides of any one of the gate lines;

In step 102, an insulating layer is formed on the base substrate on which the plurality of gate lines and the common electrode line pattern are formed;

In step 103, a via hole is formed on the insulating layer; and

In step 104, a metal conductive pattern is formed on the base substrate on which the insulating layer is formed.

The metal conductive pattern comprises a source/drain pattern and a bridging pattern, the bridging pattern comprises a plurality of bridging structures, and any of the bridging structures is electrically connected with a common electrode line and a common electrode connection block which are adjacent on two sides of one of the plurality of gate lines through the via hole.

In summary, with the method for manufacturing a display panel provided by the embodiment of the present disclosure, the common electrode line and the common electrode connection block located on two sides of a gate line are electrically connected through a bridging structure in a conductive layer made of metal, which reduces the resistance of the bridging structure, so that the voltage uniformity throughout the common electrode line pattern which is bridged through the bridging pattern is high. It solves the problem in the related art that the resistance of the transparent conductive material constituting the transparent conductive pattern is generally large and thus the voltage uniformity throughout the common electrode line pattern which is bridged through the transparent conductive pattern is low. As a result, the voltage uniformity throughout the common electrode line pattern is high.

Figure 2:
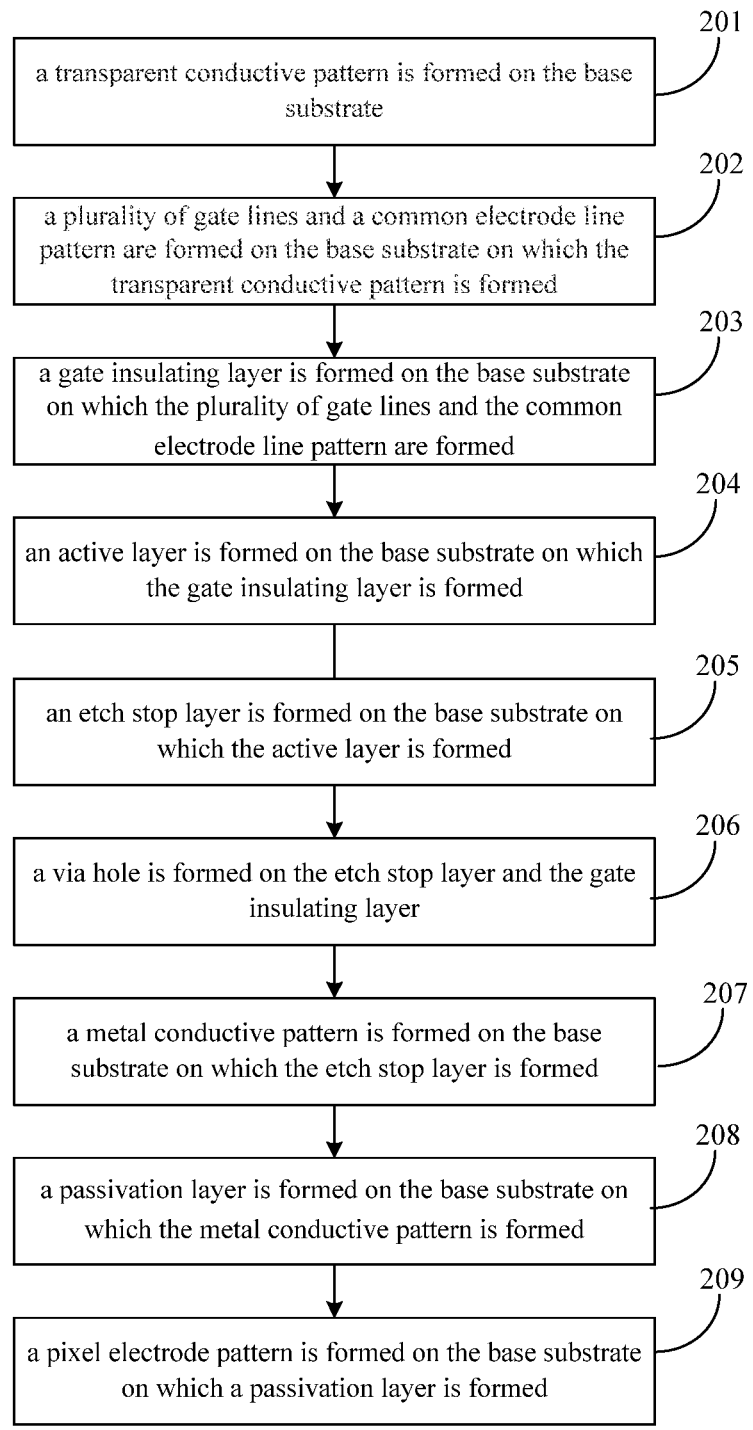
FIG. 2 is a flowchart of a method for manufacturing another display panel in accordance with an embodiment of the present disclosure.

FIG. 2 is a flowchart of a method for manufacturing another display panel in accordance with an embodiment of the present disclosure. The method may include the following steps:

In step 201, a transparent conductive pattern is formed on the base substrate;

The transparent conductive pattern may be formed by indium tin oxide (ITO).

In step 202, a plurality of gate lines and a common electrode line pattern are formed on the base substrate on which the transparent conductive pattern is formed.

The common electrode line pattern comprises a plurality of common electrode lines and a plurality of common electrode connection blocks. Among the plurality of gate lines, one common electrode line and one common electrode connection block are respectively formed on two sides of any one of the gate lines. The common electrode line pattern is electrically connected with the transparent conductive pattern formed in step 201. After the transparent conductive pattern is connected with the common electrode line pattern, it loads the common voltage provided by the common electrode line pattern. The common voltage can control a liquid crystal layer in a display panel together with a pixel electrode.

Figure 3:
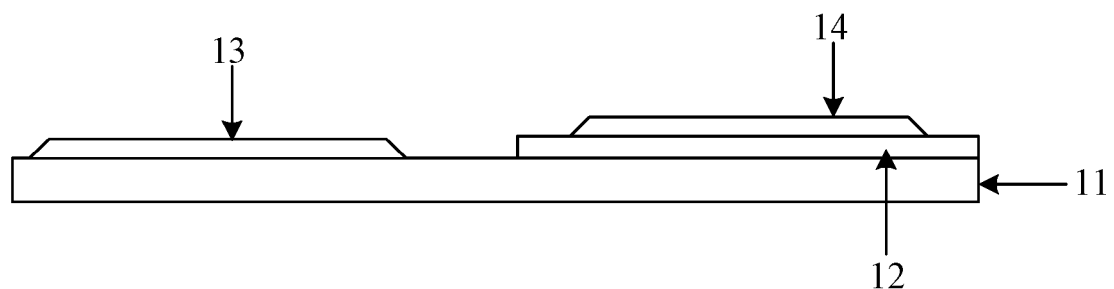
FIG. 3 is a structural diagram of a base substrate shown in the embodiment of FIG. 2.

FIG. 3 shows a structural schematic diagram of a base substrate when step 202 is completed. A transparent conductive pattern 12, a plurality of gate lines 13 and a common electrode line pattern 14 are sequentially formed on a base substrate 11. The plurality of gate lines 13 and the common electrode line pattern 14 are disposed in the same layer. A plurality of common electrode line patterns 14 are electrically connected with the transparent conductive pattern 12.

Figure 4:
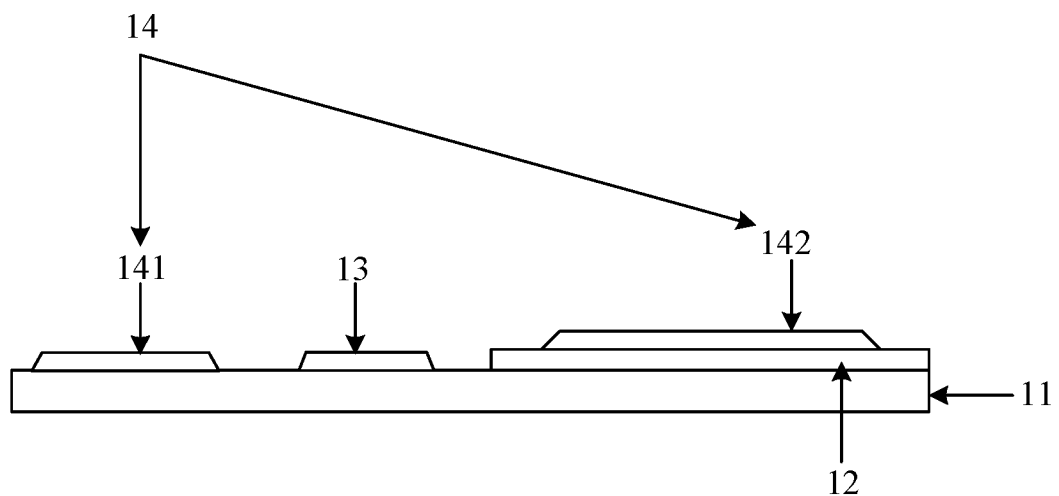
FIG. 4 is a right side view of the base substrate shown in FIG. 3.

FIG. 4 shows a right side view of the base substrate shown in FIG. 3. The common electrode line pattern 14 may include a plurality of common electrode lines 141 and a plurality of common electrode connection blocks 142. A common electrode line 141 and a plurality of common electrode connection blocks 142 are respectively formed on two sides of any gate line 13.

Figure 5:
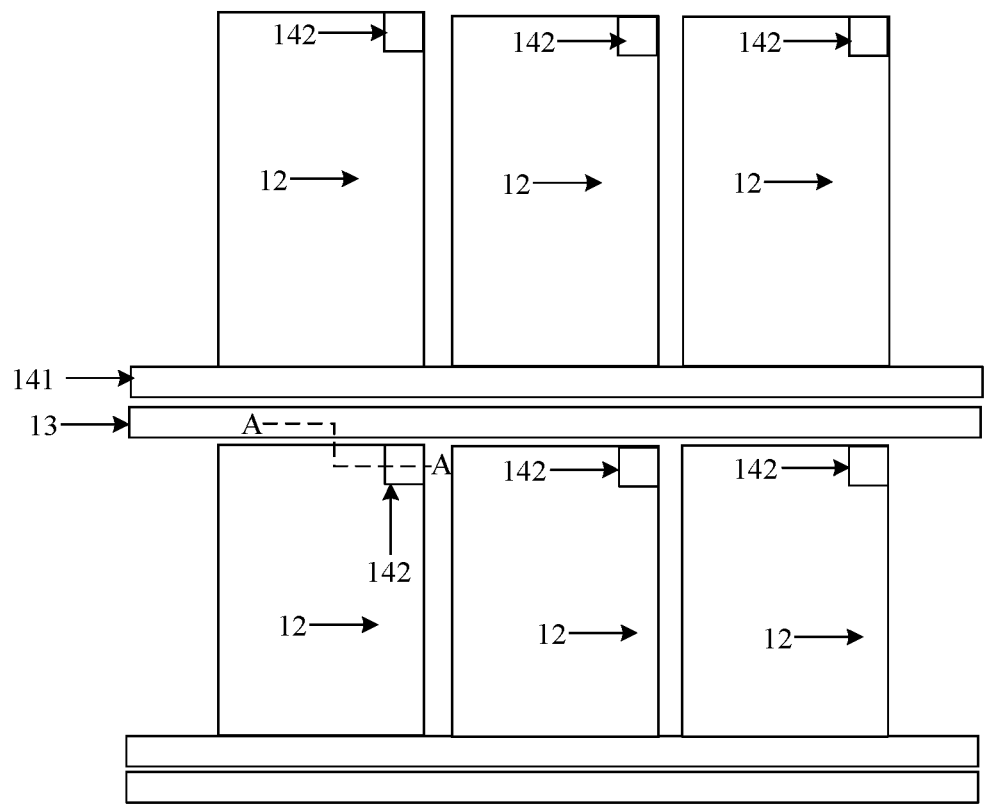
FIG. 5 is a top view of the base substrate shown in FIG. 4.

FIG. 5 shows a plan view of the base substrate shown in FIG. 4. The common electrode line pattern may include a common electrode line 141 and a common electrode connection block 142 disposed on two sides of the gate line 13. The common electrode line 141 and the common electrode connection block 142 may be both electrically connected with the transparent conductive pattern 12. FIG. 3 may be a sectional view at A-A of FIG. 5.

Optionally, the plurality of gate lines and the common electrode line patterns may be formed by one patterning process. As a result, the manufacturing process of the display panel can be reduced, and the manufacturing speed of the display panel can be increased. The patterning process may generally include steps of photoresist coating, photoresist exposing, developing, etching and photoresist stripping. The steps of the patterning process may refer to related technologies, and will not be repeated here.

In step 203, a gate insulating layer is formed on the base substrate on which the plurality of gate lines and the common electrode line pattern are formed.

The gate insulating layer can be formed by a chemical vapor deposition (CVD) technique. The gate insulating layer (GI) may be made of a material such as silicon nitride. The material of the gate insulating layer may also refer to the related art and will not be described here.

In step 204, an active layer is formed on the base substrate on which the gate insulating layer is formed.

The material of the active layer may include indium gallium zinc oxide. The active layer made of IGZO has strong electrical properties.

In step 205, an etch stop layer is formed on the base substrate on which the active layer is formed.

The etch stop layer (ESL) is used to prevent possible damage to the gate insulating layer when over-etching occurs in the etching process in the subsequent process of forming the metal conductive pattern.

The ESL may also be made of a material such as silicon nitride. The material of the ESL can also refer to related technologies and will not be repeated here.

A via hole is formed on the etch stop layer formed in this step. The via hole is used to enable the source/drain in the subsequently formed metal conductive pattern to contact the active layer.

In addition, this step is an optional step. That is, in the method for manufacturing a display panel provided by the embodiment of the present disclosure, the etch stop layer may not be formed on the gate insulating layer.

In step 206, a via hole is formed on the etch stop layer and the gate insulating layer.

The via hole is used to make abridging pattern in the subsequently formed metal conductive layer contact with the etch stop layer and the common electrode layer under the gate insulating layer. When the via hole is formed, a region where a TFT is located on the base substrate may be avoided. That is, an orthogonal projection of the via hole on the base substrate and an orthographic projection of the region where the TFT is located on the base substrate do not overlap. In this way, it is possible to avoid the influence of the via hole and the subsequently formed bridging pattern on the TFT formation and normal operation.

Figure 6:
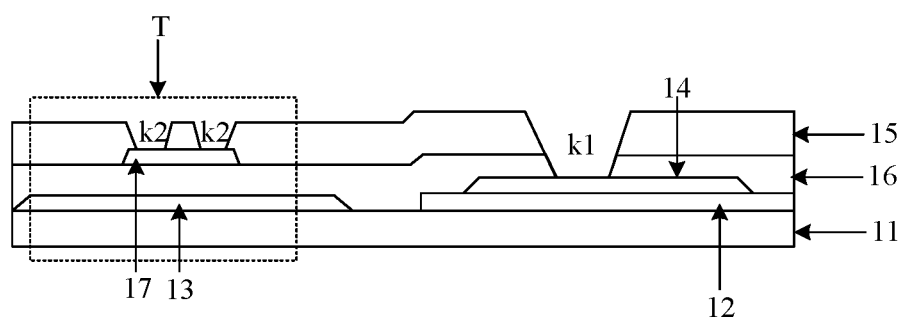
FIG. 6 is a structural diagram of another base substrate shown in the embodiment of FIG. 2.

When step 206 is completed, the structure of the base substrate may be as shown in FIG. 6. A via hole k1 is formed on an etch stop layer 15 and a gate insulating layer 16. The common electrode line pattern 14 below the etch stop layer 15 and the gate insulating layer 16 is exposed through the via hole k1. In addition, an active layer 17 may be provided between the gate insulating layer 16 and the etch stop layer 15 in the TFT region T. The etch stop layer 15 is provided with a via hole k2 in the TFT region T. The active layer 17 is exposed through the via hole k2. 11 is the base substrate.

Figure 7:
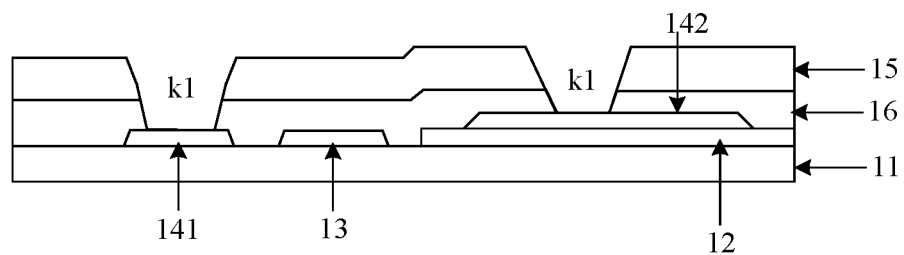
FIG. 7 is a right side view of the base substrate shown in FIG. 6.

FIG. 7 shows a right side view of the base substrate shown in FIG. 6. It can be seen that both the common electrode line 141 and the common electrode connection block 142 on two sides of the gate line 13 are exposed through the via hole k1.

In step 207, a metal conductive pattern is formed on the base substrate on which the etch stop layer is formed.

The metallic conductive pattern comprises a source/drain pattern and a bridging pattern. The bridging pattern comprises a plurality of bridging structures. Any one of the plurality of bridging structures is electrically connected with the common electrode line patterns on two sides of any one of the plurality of gate lines of the base substrate through the via holes on the etch stop layer and the gate insulating layer, respectively. The metal conductive pattern can be formed by a sputtering process.

Figure 8:
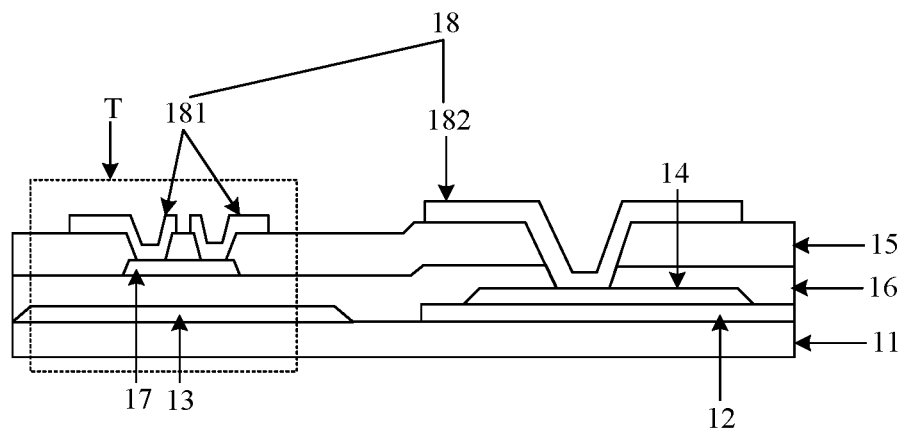
FIG. 8 is a structural diagram of yet another base substrate shown in the embodiment of FIG. 2.

When step 207 is completed, the structure of the base substrate may be as shown in FIG. 8. A source/drain pattern 181 in a metal conductive pattern 18 may be formed in the region T where the TFT is located. Abridging pattern 182 may be formed in other areas than the area T where the TFT is located. The meaning of other marks in FIG. 5 can refer to FIG. 4, and details are not described herein again.

Figure 9:
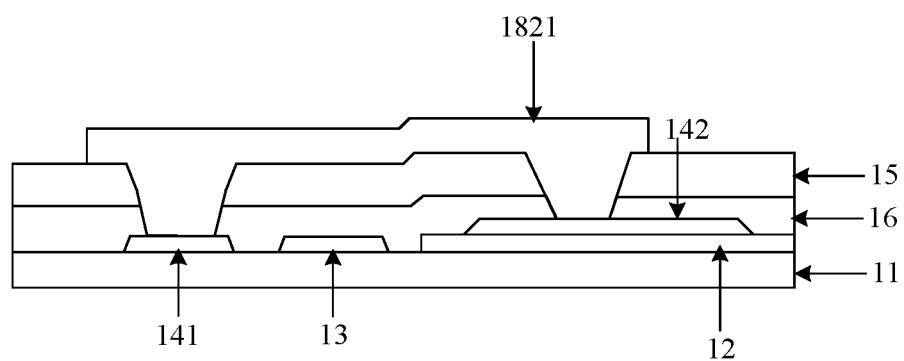
FIG. 9 is a right side view of the base substrate shown in FIG. 8.

FIG. 9 shows a right side view of the base substrate shown in FIG. 8. It can be seen that the common electrode line 141 and the common electrode connection block 142 on two sides of the gate line 13 are both electrically connected with a bridging structure 1821 in the bridging pattern. The bridging structure 1821 conducts the common electrode line 141 and the common electrode connection block 142 on two sides of the gate line 13.

Figure 10:
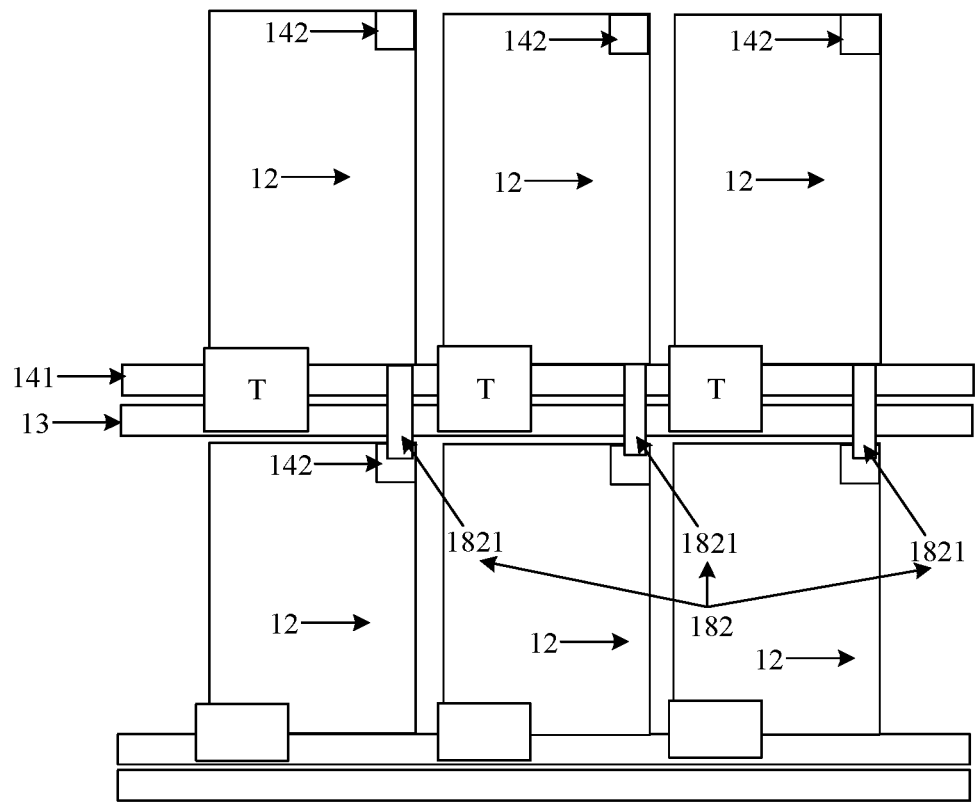
FIG. 10 is a top view of the base substrate shown in FIG. 9.

FIG. 10 is a top view of FIG. 9. As shown in FIG. 9, the bridging structure 1821 in the bridging pattern 182 electrically connects the common electrode line 141 and the common electrode connection block 142 located on two sides of the gate line 13. The transparent conductive pattern 12 electrically connected with the common electrode line 141 and the common electrode connection block 142 may also be part of the common electrode line pattern. The meanings of other marks in FIG. 10 can refer to FIG. 8, and details are not described herein again. FIG. 10 does not show the gate insulating layer and the etch stop layer for clearly illustrating the structures of the gate line and the common electrode line, but it is not limited here.

Optionally, each of the plurality of common electrode connection blocks is electrically connected with the bridging structures in the bridging pattern in one-to-one correspondence. Typically, one common electrode connection block is provided in each sub-pixel region, so that the one-to-one correspondence connection between each common electrode connection block and the bridging structure may enable the common electrode lines and the common electrode connection blocks in every two adjacent sub-pixel regions on two sides of the gate line to be electrically connected. Such a setting can ensure to a greater extent that the voltage throughout the common electrode line pattern is more uniform.

At present, in order to improve the voltage uniformity throughout the common electrode line pattern (poor voltage uniformity throughout the common electrode line pattern may cause the display panel's screen to be green), it is common to bridge the common electrode line patterns on two sides of each of the plurality of gate lines. However, since the resistance of a transparent conductive pattern used as a bridging structure (which is usually a relatively high resistance ITO) has a large resistance, a bridging structure is usually provided in each sub-pixel region to increase the voltage uniformity of the common electrode line pattern. However, when repairing a possible open circuit on a data line by chemical vapor deposition, the repair position is difficult to pull apart from the bridging structure. This makes it possible for metal powders (such as tungsten powders) produced by the chemical vapor deposition technique to be scattered on the bridging structure and cause a short circuit.

Since the bridging structure in the embodiment of the present disclosure is made of metal having a relatively low resistance, in the base substrate, each of the plurality of common electrode lines is electrically connected with one bridging structure. Each bridging structure is electrically connected with one common electrode connection block. That is, in the display panel provided by the embodiment of the present disclosure, in adjacent sub-pixel regions on two sides of a gate line, there may be no bridging structure disposed between some adjacent sub-pixel regions. After such a setting, when repairing a data line by chemical vapor deposition, the repair position may pull apart from the bridging structure. This avoids metal powders produced by the chemical vapor deposition technique being scattered on the bridging structure and causing a short circuit, improving the repair success rate. The number of bridging structures electrically connected with each common electrode line can be determined according to the requirement for the voltage uniformity throughout the common electrode line patterns. The higher the requirement for uniformity, the more bridging structure electrically connected with each common electrode line.

In step 208, a passivation layer is formed on the base substrate on which the metal conductive pattern is formed.

There may be formed on the passivation layer (PVX) a via hole which is used to bring the source/drain electrode into contact with a subsequently formed pixel electrode pattern.

In step 209, a pixel electrode pattern is formed on the base substrate on which a passivation layer is formed.

The pixel electrode pattern may be used together with the transparent conductive pattern formed in step 201 to control a liquid crystal layer in a display panel.

Figure 11:
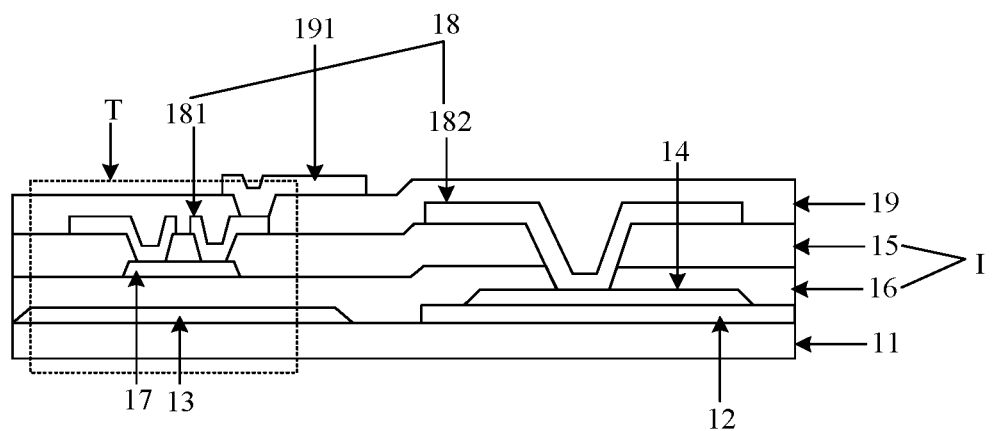
FIG. 11 is a structural diagram of still yet another base substrate shown in the embodiment of FIG. 2.

When step 209 is completed, the structure of the base substrate can be as shown in FIG. 11. A passivation layer 19 and a pixel electrode pattern 191 are sequentially disposed on the base substrate 11 on which the metal conductive pattern 18 is formed. The pixel electrode pattern 191 is electrically connected with a source/drain electrode 181 in the metal conductive pattern 18 through a via hole (not shown in FIG. 11) on the passivation layer 19. The meaning of other marks in FIG. 11 can refer to FIG. 8, and details are not described herein again.

The embodiment of the present disclosure illustrates the manufacturing of an LCD as an example, but the method for manufacturing a display panel provided by the embodiment of the present disclosure can also be applied to manufacturing an OLED. In manufacturing an OLED, a plurality of gate lines and a common electrode line pattern may be directly formed on the base substrate without performing step 201. In addition, when an OLED is manufactured, what is formed in step 207 is not a pixel electrode pattern, but is an anode pattern of an organic light emitting device in an OLED display panel. Other steps of fabricating the OLED may refer to the embodiments of the present disclosure, and details are not described herein again.

Each of the patterned layer structures (such as the transparent conductive pattern, the common electrode line pattern, and the metal conductive pattern, etc.) of the embodiments of the present disclosure may be formed by a patterning process.

In summary, in the method for manufacturing a display panel provided by the embodiment of the present disclosure, a bridging structure is formed of a metal with a relatively low resistance, and each of the plurality of common electrode lines is electrically connected with one bridging structure. In this way, no bridging structure may be disposed between some adjacent sub-pixel regions. When a data line is repaired by chemical vapor deposition technology, the repair position can be separated from the bridging structure by a certain distance. The short circuit caused by the scattering of the metal powder generated by the chemical vapor deposition technique to the bridging structure is avoided, and the repair success rate is improved.

The method for manufacturing a display panel provided by the embodiment of the present disclosure can be applied to the manufacturing of a liquid crystal display panel (LCD) or an organic light-emitting diode (OLED) display panel. The Thin Film Transistor (TFT) in the display panel to which the embodiment of the present disclosure is applied may be an indium gallium zinc oxide (IGZO) TFT. The carrier mobility of the IGZO TFT is high, which can greatly increase the charge/discharge rate of the TFT to the pixel electrode, increase the response speed of the pixel, and achieve a faster refresh rate.

FIG. 11 schematically shows a structure of a display panel provided by an embodiment of the present disclosure. As shown in FIG. 7, the display panel comprises a base substrate 11.

A plurality of gate lines 13 and a plurality of common electrode line patterns 14 are disposed on the base substrate 11. The plurality of gate lines 13 divides the base substrate 11 into a plurality of regions. The common electrode line patterns 14 are located in different regions of the plurality of regions.

An insulating layer I is disposed on the base substrate 11 on which the plurality of gate lines 13 and the plurality of common electrode line patterns 14 are disposed.

A via hole (not shown in FIG. 7) is disposed on the insulating layer I.

A metal conductive pattern 18 is disposed on the base substrate 11 on which the insulating layer I is disposed.

In FIG. 11, the metal conductive pattern 18 comprises a source/drain pattern 181 and a bridging pattern 182 comprising a plurality of bridging structures. FIG. 10 shows a top view of the display panel shown in FIG. 11. Any bridging structure 1821 is electrically connected with the common electrode line 141 and the common electrode connection block 142 in the common electrode line pattern through a via hole. The common electrode line 141 and the common electrode connection block 142 are respectively located on two sides of one of the plurality of gate lines 13.

In summary, the display panel provided by the embodiment of the present disclosure electrically connects two common electrode line patterns located on two sides of a gate line through a bridging structure in a conductive layer made of metal, which reduces the resistance of the bridging structure, so that the voltage uniformity throughout the common electrode line pattern which is bridged through the bridging pattern is high. It solves the problem in the related art that the resistance of the transparent conductive material constituting the transparent conductive pattern is generally large and thus the voltage uniformity throughout the common electrode line pattern which is bridged through the transparent conductive pattern is low. As a result, the voltage uniformity throughout the common electrode line pattern is high.

As shown in FIG. 7, the insulating layer I comprises a gate insulating layer 16 and an etch stop layer 15. The gate insulating layer 16 is disposed on the base substrate 11 on which the plurality of gate lines 13 and the plurality of common electrode line patterns 14 are disposed.

The etch stop layer 15 is disposed on the base substrate 11 on which the gate insulating layer 16 is disposed.

Optionally, a transparent conductive pattern 12 is further disposed on the base substrate 11.

The plurality of gate lines 13 and the plurality of common electrode line patterns 14 are disposed on the base substrate 11 on which the transparent conductive pattern 12 is disposed. The plurality of common electrode line patterns 14 are electrically connected with the transparent conductive pattern 12.

Optionally, an orthogonal projection of the via hole on the base substrate 11 and an orthogonal projection of the region T where the TFT is on the base substrate 1 do not overlap.

Optionally, an active layer 17 is disposed on the base substrate 11 on which the gate insulating layer 16 is disposed. The etch stop layer 15 is disposed on the base substrate 11 on which the active layer 17 is disposed. The material of the active layer 17 may include indium gallium zinc oxide. The material of the gate insulating layer 16 may include silicon nitride. The material of the etch stop layer 15 may include silicon nitride.

Optionally, the plurality of gate lines 13 and the common electrode line patterns 14 are disposed in the same layer.

Optionally, a passivation layer 19 is disposed on the base substrate 11 on which the metal conductive pattern 18 is disposed. A pixel electrode pattern 191 is disposed on the base substrate 11 on which the passivation layer 19 is disposed. The metal conductive pattern 18 may include a composite metal film layer such as a composite metal film layer made of titanium, aluminum, and titanium. Since the bridging structure in the embodiment of the present disclosure is a metal structure with a relatively low electrical resistance. Thus, each of the plurality of common electrode lines may be electrically connected with one bridging structure. In this way, the bridging structure may not be disposed between some adjacent sub-pixel regions. When a data line is repaired by chemical vapor deposition technology, the repair position can be separated from the bridging structure by a certain distance. The short circuit caused by the scattering of the metal powder generated by the chemical vapor deposition technique to the bridging structure is avoided, and the success rate of the repair is improved.

In addition, a display device is provided according to an embodiment of the present disclosure. The display device may include a display panel manufactured by the method shown in FIG. 1 or a display panel manufactured by the method shown in FIG. 2. Exemplarily, the display panel may have a structure as shown in FIG. 7.

It should be pointed out that in the drawings, the dimensions of layers and regions may be exaggerated for clarity of illustration. It will also be understood that when an element or layer is referred to as being "on" another element or layer, it can be directly on the other element or there may be an intervening layer. In addition, it will be understood that when an element or layer is referred to as being "under" another element or layer, it can be directly under, and there may be more than one middle layer or element. In addition, it will also be understood that when a layer or element is referred to as being "between" two layers or two elements, it can be a single layer between two layers or two elements, or there may be more than one middle layer or element. Like reference numerals refer to like elements throughout the whole disclosure.

The foregoing is only exemplary embodiments of the present disclosure, and is not intended to limit the present disclosure. Within the spirit and principles of the disclosure, any modifications, equivalent substitutions, improvements, etc., are within the scope of protection of the present disclosure.

What is claimed is:

1. A method for manufacturing a display panel, comprising steps of:

forming a plurality of gate lines and a common electrode line pattern on a base substrate, the common electrode line pattern comprising a plurality of common electrode lines and a plurality of common electrode connection blocks, and one common electrode line and one common electrode connection block being respectively formed on two sides of any one of the gate lines;

forming an insulating layer on the base substrate on which the plurality of gate lines and the common electrode line pattern are formed;

forming a via hole on the insulating layer; and forming a metal conductive pattern on the base substrate on which the insulating layer is formed, wherein the metal conductive pattern comprises a source/
drain pattern and a bridging pattern, the bridging pattern comprising a plurality of bridging structures, and
any one of the bridging structures being electrically
connected with a common electrode line and a common
electrode connection block which are adjacent on two
sides of one of the plurality of gate lines through the via
hole.

2. The method according to claim 1, wherein the insulating layer comprises a gate insulating layer and an etch stop layer,
said step of forming an insulating layer on the base
substrate on which the plurality of gate lines and the
common electrode line pattern are formed comprises:
forming the gate insulating layer on the base substrate on
which the plurality of gate lines and the common
electrode line pattern are formed; and
forming the etch stop layer on the base substrate on which
the gate insulating layer is formed.

3. The method according to claim 2, wherein said step of
forming a via hole on the insulating layer comprises:
forming the via hole on the etch stop layer and the gate
insulating layer.

4. The method according to claim 2, before said step of
forming the etch stop layer on the base substrate on which
the gate insulating layer is formed, the method further
comprising:
forming an active layer on the base substrate on which the
gate insulating layer is formed; and
said step of forming the etch stop layer on the base
substrate on which the gate insulating layer is formed
comprises:
forming the etch stop layer on the base substrate on which
the active layer is formed.

5. The method according to claim 1, before said step of
forming a plurality of gate lines and a common electrode line
pattern on a base substrate, the method further comprises:
forming a transparent conductive pattern on the base
substrate; and
said step of forming a plurality of gate lines and a
common electrode line patters on a base substrate
comprises:
forming the plurality of gate lines and the common
electrode line pattern on the base substrate on which the
transparent conductive pattern is formed, the common
electrode line pattern being electrically connected with
the transparent conductive pattern.

6. The method according to claim 5, wherein said step of
forming the plurality of gate lines and the common electrode
line pattern on the base substrate on which the transparent
conductive pattern is formed comprises:
forming the plurality of gate lines and the common
electrode line pattern on the base substrate on which the
transparent conductive pattern is formed by one patterning process.

7. The method according to claim 5, after said step of
forming a metal conductive pattern on the base substrate on
which the insulating layer is formed, the method further
comprises:
forming a passivation layer on the base substrate on which
the metal conductive pattern is formed; and
forming a pixel electrode pattern on the base substrate on
which the passivation layer is formed.

8. The method according to claim 1, wherein in the base
substrate, the plurality of common electrode connection
blocks are electrically connected with the bridging structures
in the bridging pattern in one-to-one correspondence.

9. The method according to claim 1, wherein in the base
substrate, each of the plurality of common electrode lines is
electrically connected with one of the bridging structures.

10. A display panel, comprising a base substrate, wherein
a plurality of gate lines and a common electrode line
pattern are disposed on the base substrate, the common
electrode line pattern comprising a plurality of common
electrode lines and a plurality of common electrode
connection blocks, one common electrode line and one
common electrode connection block being respectively
formed on two sides of any one of the gate lines;
an insulating layer is disposed on the base substrate on
which the plurality of gate lines and the common
electrode line pattern are disposed;
a via hole is disposed on the insulating layer; and
a metal conductive pattern is disposed on the base substrate on which the insulating layer is disposed,
the metal conductive pattern comprising a source/drain
pattern and a bridging pattern comprising a plurality of
bridging structures, and any of the bridging structures
being electrically connected with a common electrode
line and a common electrode connection block which
are adjacent on two sides of one of the plurality of gate
lines through the via hole.

11. The display panel according to claim 10, wherein the
insulating layer comprises a gate insulating layer and an etch
stop layer,
the gate insulating layer is disposed on the base substrate
on which the plurality of gate lines and the common
electrode line pattern are disposed; and
the etch stop layer is disposed on the base substrate on
which the gate insulating layer is disposed.

12. The display panel according to claim 10, wherein an
orthogonal projection of the via hole on the base substrate
and an orthographic projection of a region where a thin film
transistor is located on the base substrate do not overlap.

13. The display panel according to claim 11, wherein an
active layer is disposed on the base substrate on which the
gate insulating layer is disposed; and
the etch stop layer is disposed on the base substrate on
which the active layer is disposed.

14. The display panel according to claim 10, wherein a
transparent conductive pattern is further disposed on the
base substrate, and
the plurality of gate lines and the common electrode line
pattern are disposed on the base substrate on which the
transparent conductive pattern is disposed, and the
common electrode line pattern is electrically connected
with the transparent conductive pattern.

15. The display panel according to claim 14, wherein the
plurality of gate lines and the common electrode line pattern
are disposed in the same layer.

16. The display panel according to claim 10, wherein a
passivation layer is disposed on the base substrate on which
the metal conductive pattern is disposed, and
a pixel electrode pattern is disposed on the base substrate
on which the passivation layer is disposed.

17. The display panel according to claim 10, wherein the
material of the active layer comprises indium gallium zinc
oxide.

18. The display panel according to claim 10, wherein the
material of the gate insulating layer comprises silicon
nitride.

19. The display panel according to claim 10, wherein the
material of the etch stop layer comprises silicon nitride.

20. A display device, comprising a display panel, the
display panel comprising a base substrate, wherein a plurality of gate lines and a common electrode line pattern are disposed on the base substrate, the common electrode line pattern comprising a plurality of common electrode lines and a plurality of common electrode connection blocks, and one common electrode line and one common electrode connection block being respectively formed on two sides of any one of the gate lines;

an insulating layer is disposed on the base substrate on which the plurality of gate lines and the common electrode line pattern are disposed;

a via hole is disposed on the insulating layer;

a metal conductive pattern is disposed on the base substrate on which the insulating layer is disposed, the metal conductive pattern comprising a source/drain pattern and a bridging pattern comprising a plurality of bridging structures, and any of the bridging structures being electrically connected with a common electrode line and a common electrode connection block which are adjacent on two sides of one of the plurality of gate lines through the via hole.

* * * * *